(12) United States Patent
Metz et al.

(10) Patent No.: US 7,425,500 B2
(45) Date of Patent: Sep. 16, 2008

(54) UNIFORM SILICIDE METAL ON EPITAXIALLY GROWN SOURCE AND DRAIN REGIONS OF THREE-DIMENSIONAL TRANSISTORS

(75) Inventors: Matthew V. Metz, Hillsboro, OR (US);
Suman Datta, Beaverton, OR (US);
Mark L. Doczy, Beaverton, OR (US);
Jack T. Kavalieros, Portland, OR (US);
Justin K. Brask, Portland, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 144 days.

(21) Appl. No.: 11/395,940

(22) Filed: Mar. 31, 2006

(65) Prior Publication Data
US 2007/0231984 A1 Oct. 4, 2007

(51) Int. Cl.
*H01L 21/44* (2006.01)
(52) U.S. Cl. ..................................... 438/607
(58) Field of Classification Search ................. 438/607, 438/655, 666, 682; 257/757, 768
See application file for complete search history.

(56) References Cited

U.S. PATENT DOCUMENTS

| | | | |
|---|---|---|---|
| 5,804,848 A | 9/1998 | Mukai | |
| 5,844,278 A | 12/1998 | Mizuno et al. | |
| 5,899,710 A | 5/1999 | Mukai | |
| 6,018,176 A | 1/2000 | Lim | |
| 6,066,869 A | 5/2000 | Noble et al. | |
| 6,413,802 B1 | 7/2002 | Hu et al. | |
| 6,459,123 B1 | 10/2002 | Enders et al. | |
| 6,472,258 B1 | 10/2002 | Adkisson et al. | |
| 6,525,403 B2 | 2/2003 | Inaba et al. | |
| 6,562,665 B1 | 5/2003 | Yu | |
| 6,583,469 B1 | 6/2003 | Fried et al. | |
| 6,611,029 B1 | 8/2003 | Ahmed et al. | |
| 6,630,388 B2 | 10/2003 | Sekigawa et al. | |
| 6,635,909 B2 | 10/2003 | Clark et al. | |
| 6,642,090 B1 | 11/2003 | Fried et al. | |
| 6,657,259 B2 | 12/2003 | Fried et al. | |
| 6,689,650 B2 | 2/2004 | Gambino et al. | |
| 6,770,516 B2 | 8/2004 | Wu et al. | |
| 6,787,402 B1 | 9/2004 | Yu | |
| 6,794,718 B2 | 9/2004 | Nowak et al. | |
| 6,798,000 B2 | 9/2004 | Luyken et al. | |
| 6,800,910 B2 | 10/2004 | Lin et al. | |
| 6,803,631 B2 | 10/2004 | Dakshina-Murthy et al. | |
| 6,812,075 B2 | 11/2004 | Fried et al. | |
| 6,815,277 B2 | 11/2004 | Fried et al. | |
| 6,821,834 B2 | 11/2004 | Ando | |
| 6,833,588 B2 | 12/2004 | Yu et al. | |

(Continued)

OTHER PUBLICATIONS

Park, Jong-Tae et al., "Pi-Gate SOI MOSFET," IEEE Electron Device Letters, vol. 22, No. 8, Aug. 2001, pp. 405-406.

(Continued)

*Primary Examiner*—Calvin Lee
(74) *Attorney, Agent, or Firm*—Blakely, Sokoloff, Taylor & Zafman LLP

(57) ABSTRACT

A method for fabricating a three-dimensional transistor is described. Atomic Layer Deposition of nickel, in one embodiment, is used to form a uniform silicide on all epitaxially grown source and drain regions, including those facing downwardly.

16 Claims, 2 Drawing Sheets

U.S. PATENT DOCUMENTS

| | | |
|---|---|---|
| 6,835,614 B2 | 12/2004 | Hanafi et al. |
| 6,849,884 B2 | 2/2005 | Clark et al. |
| 6,869,868 B2 | 3/2005 | Chiu et al. |
| 6,885,055 B2 | 4/2005 | Lee |
| 6,897,527 B2 | 5/2005 | Dakshina-Murthy et al. |
| 2005/0156171 A1 | 7/2005 | Brask et al. |
| 2006/0068590 A1 | 3/2006 | Lindert et al. |

OTHER PUBLICATIONS

Choi, Yang-Kyu et al., "Sub-20nm CMOS FinFET Technologies," IEEE IEDM 01-421, (2001) pp. 19.1.1-19.1.4.

Doyle, et al., U.S. Appl. No. 11/322,795, filed Dec. 29, 2005.

$Ni[(CH(CH_3)_2NC(CH_3)NCH(CH_3)_2]_2 + H_2 \rightarrow Ni^0 + 2\, H[(CH(CH_3)_2NC(CH_3)NCH(CH_3)_2]$ Where $Ni[(CH(CH_3)_2NC(CH_3)NCH(CH_3)_2]_2 =$

UNIFORM SILICIDE METAL ON EPITAXIALLY GROWN SOURCE AND DRAIN REGIONS OF THREE-DIMENSIONAL TRANSISTORS

FIELD OF THE INVENTION

The invention relates to three-dimensional field-effect transistors.

PRIOR ART AND RELATED ART

Three-dimensional transistors, also referred to as non-planer transistors and tri-gate transistors, provide great promise for more densely packed transistors with better performance.

In some cases, a semiconductor body such as a silicon body is used to form a transistor in a replacement gate process. In other cases a polysilicon gate or other gate is used. During the processing, some of the body is lost outside of the channel region during cleaning and other processing steps. This results in increased external resistance. To reduce external resistance, it is often necessary to increase the cross-sectional area of the source and drain regions without increasing the channel size. For these reasons, epitaxial growth is used to re-grow a semiconductor material on the source and drain regions. Then, a silicide is formed from a metal such as titanium, tungsten, nickel, cobalt or other metal on the exposed semiconductor material. The fabrication of these transistors is described in "Non-planar Transistors with Metal Gate Electrodes," U.S. 2005/0156171.

Other problems and processes associated particularly with the epitaxial source and drain regions are described in "Metal Gate Transistor with an Epitaxial Source and Drain Regions," application Ser. No. 10/955,669, filed Sep. 29, 2004; and "Method and Structure for Reducing the Epitaxial Resistance of a Three-Dimensional Transistor Through use of Epitaxial Layers," application Ser. No. 11/322,795, filed Dec. 29, 2005, both assigned to the assignee of the present application.

DETAILED DESCRIPTION

A process for fabricating a three-dimensional, field-effect transistor and the resultant transistor are described. In the following description, numerous specific details are set forth such as specific chemistries, in order to provide a thorough understanding of the present invention. It will be apparent to one skilled in the art, that the present invention may be practiced without these specific details. In other instances, well-known processing steps, such as cleaning steps, are not described in detail in order not to unnecessarily obscure the present invention.

Figure 1:
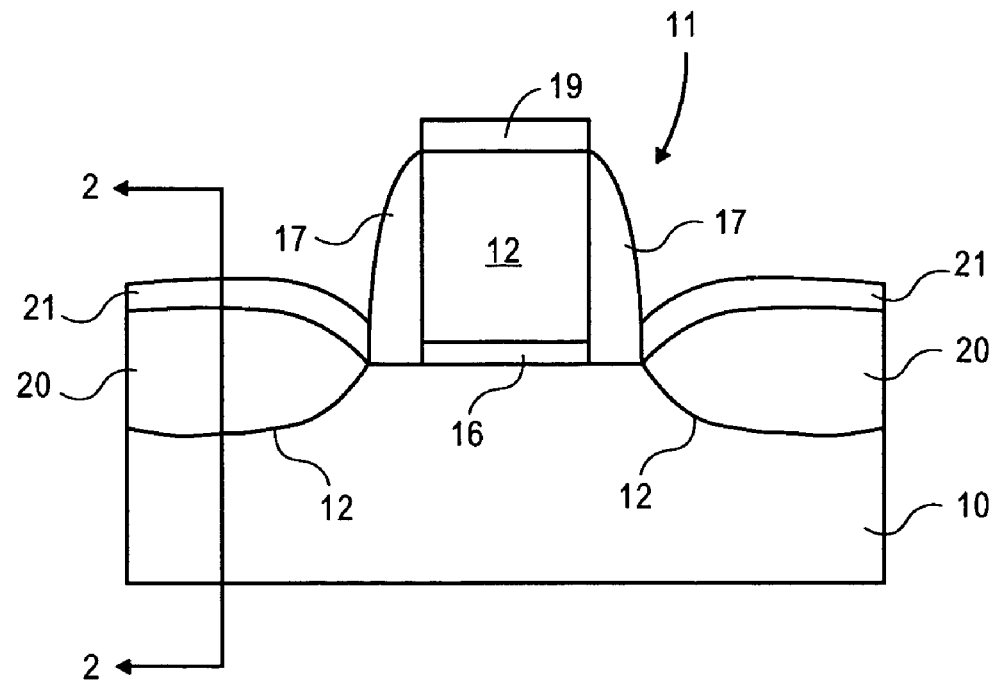
FIG. 1 is a cross-sectional, elevation view of a three-dimensional field-effect transistor.

Referring now to FIG. 1, a monocrystalline semiconductor body or fin 10 is illustrated. By way of example, the fin 10 may be fabricated on a monocrystalline silicon substrate by etching the substrate, or by growing silicon fins on the substrate. Similarly, the fin 10 may be fabricated from a monocrystalline silicon layer disposed on a buried oxide. This silicon-on-insulator (SOI) substrate is well-known in the semiconductor industry. A gate structure 11 is disposed over a channel region of the body 10. The gate structure 11 covers three sides of the body 10. This is not apparent from the cross-sectional view of FIG. 1.

The point in the processing shown in FIG. 1 is prior to the formation of the replacement gate where a replacement gate is used. In another embodiment, the gate 12 is the actual gate for the device. The gate structure 11, at this point in processing, typically includes a protective oxide 16 which separates a sacrificial or dummy gate 12 or a final gate 12, for instance a polysilicon gate, from the channel region of a transistor. Silicon nitride spacers are formed on the sides of the dummy gate 12 after a tip implant for the source and drain regions. The dummy gate or final gate 12 is protected by a hard mask 19 which, among other things, prevents silicon growth on the dummy gate or final gate 12.

During the fabrication of the transistor shown in FIG. 1, several processing steps occur, including cleaning steps, which cause some of the body 10 to be lost, particularly outside of the gate structure 11. The lines 12 show the silicon lost from the fin 10 during typical processing.

The body 10 is thickened by epitaxial growth to make up for the loss of the fin material in the source and drain region. The regions 20 shown in FIG. 1, which are part of the main source and drain regions, are grown on the fin 10. These regions, as described in the references cited above, help reduce the external resistance of the transistor.

As is often done with field-effect transistors, a silicide (or silicide) metal is formed on the exposed silicon surfaces. Most typically, the metal is sputtered (physical vapor deposition) and then the silicide is formed in a subsequent high temperature step. In FIG. 1, the silicide 21 is shown formed on the regions 20. Where a polysilicon gate is used as the final gate, the silicide is typically formed on the gate also.

Figure 2:
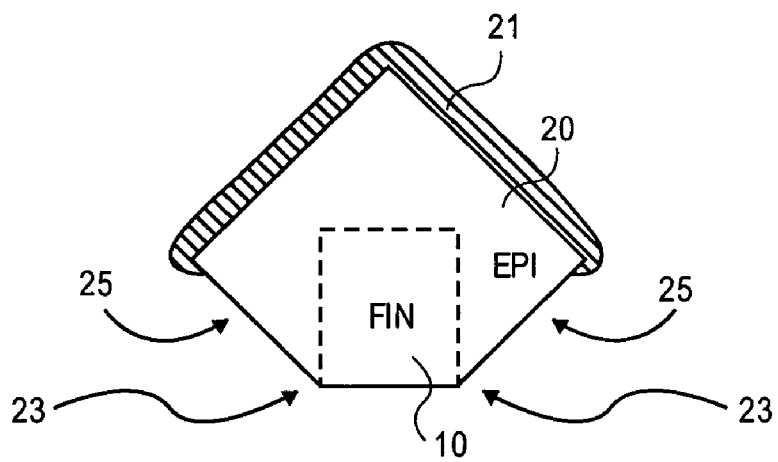
FIG. 2 is a cross-sectional view of the transistor of FIG. 1 taken through section line 2-2 of FIG. 1. This view is used to show the problems associated with prior art processing.

In FIG. 2, the epitaxial silicon region 20 is shown in cross-section, surrounding the fin 10 of FIG. 1. Since the silicon grows from the fin 10, less growth occurs at the edges 23 because there is no silicon on one side of this edge. The body 10 is typically disposed between oxide or nitride regions or formed on an oxide layer. As shown in FIG. 2, this results in the epitaxial regions 20 having the overhangs 25 or other facets facing at least partially downward. These overhangs and facets have no upwardly facing surfaces, and consequently, when metal is sputtered onto the silicon, they do not receive a layer of metal. Therefore, there is no silicide formed on these overhangs and downwardly facing facets. This is illustrated in FIG. 2 by the silicide 21 covering only the upwardly facing surfaces of the epitaxial region 20.

It will be appreciated that FIG. 2 is an idealized view of the epitaxial region 20. In practice, the fin 10 from which the epitaxial layer grows, is not as well-defined as shown in FIG. 2, and there are most often more facets than the single clean overhangs 25 shown in FIG. 2. Moreover, there are also vertical standing surfaces associated with the epitaxial region 20 which also do not receive metal. Thus, the silicide is typically non-uniform.

A uniform silicide over the entire source and drain regions is desirable. Without it, non-uniform behavior occurs. For instance, lags or delays occur because of charge pockets preventing all parts of a tri-gate transistor from turning on at the same time.

Figure 3:
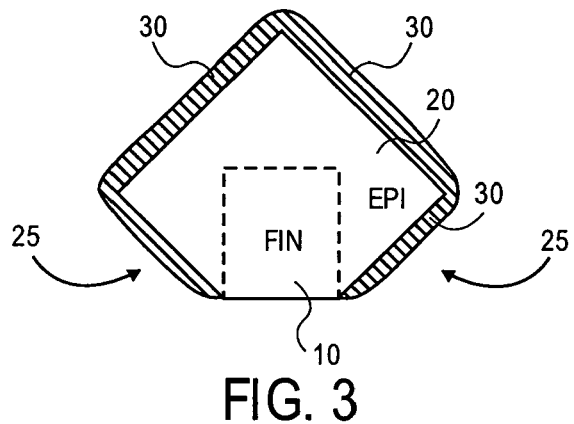
FIG. 3 is a cross-sectional, elevation view, again taken through section line 2-2 of FIG. 1. This view illustrates the improved silicide layer resulting from the teachings of the present invention.

To assure a uniform metal deposition, and a subsequent uniform silicide layer, metal must be deposited on the overhangs or other downwardly facing facets, as well as on the vertical surfaces. As shown in FIG. 3, this results in a uniform silicide layer 30 formed over the epitaxially grown region 20.

Atomic layer deposition (ALD) is used to obtain a conformal metal deposition on all the epitaxial surfaces. The vapors associated with ALD are not charge driven from a source and therefore are not deposited just on the "line of sight" from a metal source. Rather, they form on all regions, independently of orientation.

Figure 4:
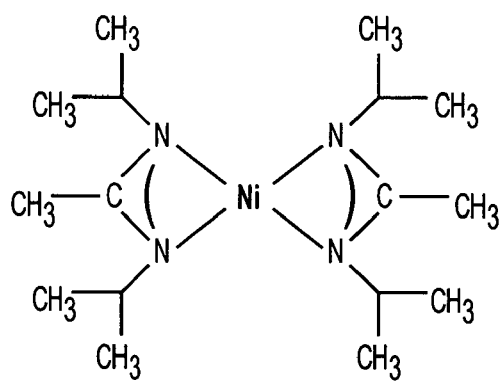
FIG. 4 illustrates a particular nickel compound and a reaction for forming nickel, used as the metal in the silicide, for one embodiment.

A silicide metal using nickel is one ALD process that may be used. Specifically as shown in FIG. 4, the nickel precursor homoleptic N,N'-dialkylacetamidinato nickel is used. This precursor, when combined with molecular hydrogen as shown in FIG. 4, yields nickel on the epitaxially grown surfaces. This ALD process yields an entirely uniform nickel deposition on the epitaxial silicon, even on the overhangs and other downwardly facing facets as well as on vertical surfaces. Thereafter, when the silicide is formed, it is uniform over the entire exposed source and drain regions. Other metal silicides may be used.

A uniform metal deposition may be achieved on all the epitaxial surfaces in a controlled chemical vapor deposition (CVD) process. Care must be taken, however, to obtain a thin metal layer needed for the silicide.

Thus, a uniform silicide on all surfaces of an epitaxially grown source and drain region of the tri-gate transistor has been disclosed.

What is claimed is:

1. A method for fabricating a three-dimensional semiconductor device comprising:
    growing an epitaxial layer on source and drain regions of a three-dimensional semiconductor body which includes a gate structure, where the growth results in facets facing at least partially downward; and
    forming a silicide metal selectively on the epitaxial layer, such that the metal forms on the facets facing at least partially downward.

2. The method defined by claim 1, wherein the suicide metal is formed using a controlled chemical vapor deposition (CVD).

3. The method defined by claim 1, wherein the silicide is formed with a relatively uniform thickness including on the facets facing at least partially downward.

4. The method defined by claim 3, wherein the silicide metal is formed using atomic layer deposition (ALD).

5. The method defined by claim 4, wherein the body comprises silicon.

6. The method defined by claim 5, wherein the epitaxial growth comprises growing silicon.

7. The method defined by claim 6, wherein the forming of the silicide method includes depositing nickel.

8. The method defined by claim 7, wherein the deposition of the nickel includes use of a homoleptic nitrogen.

9. The method defined by claim 8, wherein the ALD process employs hydrogen.

10. The method defined by claim 9, wherein the ALD process employs homoleptic N,N'-dialkylacetamidinato nickel.

11. A method for fabricating a three-dimensional semiconductor device comprising:
    forming a silicon body;
    forming a gate structure covering at least three sides of the body;
    growing an epitaxial layer on the body adjacent the gate structure, the epitaxial layer having overhung regions with facets with downwardly facing surfaces; and
    selectively forming a substantially uniform silicide metal on the epitaxial layer including on the downwardly facing surfaces.

12. The method defined by claim 11, wherein the forming of the silicide metal uses atomic layer deposition (ALD).

13. The method defined by claim 12, wherein the ALD process includes the deposition of nickel.

14. The method defined by claim 13, wherein the formation of the nickel silicide includes the use of a homoleptic nitrogen nickel precursor.

15. The method defined by claim 14, including the use of hydrogen with the nickel precursor.

16. The method defined by claim 15, including the use of homoleptic N,N'dialkylacetamidinato nickel.

* * * * *

UNITED STATES PATENT AND TRADEMARK OFFICE
CERTIFICATE OF CORRECTION

PATENT NO.        : 7,425,500 B2
APPLICATION NO.   : 11/395940
DATED             : September 16, 2008
INVENTOR(S)       : Metz et al.

Page 1 of 1

It is certified that error appears in the above-identified patent and that said Letters Patent is hereby corrected as shown below:

In column 4, at line 1, delete "suicide" and insert --silicide--.

Signed and Sealed this

Fifteenth Day of September, 2009

David J. Kappos
*Director of the United States Patent and Trademark Office*